US012810929B2

(12) United States Patent
Kim

(10) Patent No.: US 12,810,929 B2
(45) Date of Patent: Nov. 24, 2026

(54) METHOD AND APPARATUS FOR DUAL EDGE MEMORY WRITE OPERATION

(71) Applicant: Microchip Technology Incorporated, Chandler, AZ (US)

(72) Inventor: James Kim, Milpitas, CA (US)

( * ) Notice: Subject to any disclaimer, the term of this patent is extended or adjusted under 35 U.S.C. 154(b) by 96 days.

(21) Appl. No.: 18/914,119

(22) Filed: Oct. 12, 2024

(65) Prior Publication Data

US 2025/0124978 A1 Apr. 17, 2025

Related U.S. Application Data

(60) Provisional application No. 63/544,109, filed on Oct. 13, 2023.

(51) Int. Cl.
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC ............................ G11C 11/419; G11C 11/412
USPC ........................................ 365/189.05, 189.16
See application file for complete search history.

(56) References Cited

U.S. PATENT DOCUMENTS 6,747,886 B1 * 6/2004 Morikawa .............. G11C 15/00 365/189.11
8,526,246 B2 * 9/2013 Gupta ...................... G11C 7/22 365/189.16
8,634,232 B2 * 1/2014 Oh ........................... G11C 8/08 365/158
9,514,841 B1 * 12/2016 Christensen ........ G11C 11/4078
11,770,274 B1 * 9/2023 Liu ................... H04L 25/03057 375/233
11,831,153 B1 * 11/2023 Bala ....................... H02H 9/046
2005/0117403 A1 * 6/2005 Fujisawa ................ G11C 7/222 365/189.05
2010/0157699 A1 * 6/2010 Gupta .................. G11C 7/1096 365/189.16
2012/0257444 A1 * 10/2012 Oh ...................... G11C 11/1675 365/158
2013/0326111 A1 * 12/2013 Arsovski ................ G11C 15/04 711/108
2020/0005858 A1 * 1/2020 Fujiwara .................. G11C 8/08

(Continued)

FOREIGN PATENT DOCUMENTS

JP 2018125053 A 8/2018
WO 2018160383 A1 9/2018

OTHER PUBLICATIONS

International Search Report & Written Opinion issued on Jan. 13, 2025, in corresponding International Application No. PCT/US2024/051225 (15 pages).

*Primary Examiner* — Michael T Tran
(74) *Attorney, Agent, or Firm* — Shumaker, Loop & Kendrick, LLP; Ryan M. Corbett; Andrew P. Stevens

(57) ABSTRACT

An apparatus for dual edge memory write operation is provided. The apparatus may include a write enable circuit to receive a write enable signal for writing data to a memory cell, and a write driver circuit to receive a data signal and a complementary data signal, and output a bus signal and a complementary bus signal to the memory cell. The write driver circuit may be coupled to the write enable circuit. The write enable circuit may initiate a write operation to write data to the memory cell based on a falling edge of the write enable signal.

20 Claims, 3 Drawing Sheets

(56) References Cited

U.S. PATENT DOCUMENTS

| | | | | |
|---|---|---|---|---|
| 2023/0206970 | A1 | 6/2023 | Pilo | |
| 2023/0274769 | A1 | 8/2023 | Akkaya et al. | |
| 2024/0274064 | A1* | 8/2024 | Knausz | G09G 3/32 |
| 2025/0087291 | A1* | 3/2025 | Yu | G11C 29/46 |
| 2026/0064723 | A1* | 3/2026 | Park | G06F 16/285 |

* cited by examiner

METHOD AND APPARATUS FOR DUAL EDGE MEMORY WRITE OPERATION

CROSS-REFERENCE TO RELATED APPLICATION

The present application claims priority to U.S. Provisional Patent Application No. 63/544,109, entitled: Method and Apparatus for Dual Edge Memory Write Operation, filed on Oct. 13, 2023, the contents of which are hereby incorporated by reference in their entirety.

TECHNICAL FIELD

The present disclosure relates generally to memory write operations, and more specifically to memory write operations using rising and falling edges to initiate the write operation.

SUMMARY

According to an aspect of one or more examples, there is provided an apparatus that may include a write enable circuit to receive a write enable signal for writing data to a memory cell, and a write driver circuit to receive a data signal and a complementary data signal, and output a bus signal and a complementary bus signal to the memory cell, wherein the write driver circuit is coupled to the write enable circuit. The write enable circuit may initiate a write operation to write data to the memory cell based on a falling edge of the write enable signal. The write enable circuit may initiate a write operation to write data to the memory cell based on a falling edge of the write enable signal when a supply voltage to the write driver circuit is below a first threshold voltage. The write enable circuit may initiate a write operation to write data to the memory cell based on a rising edge of the write enable signal when a supply voltage to the write driver circuit is above a second threshold voltage. The first threshold voltage may be approximately 0.5 volts and the second threshold voltage may be approximately 0.8 volts.

The write enable circuit may include a first NMOS transistor having a gate terminal to receive the write enable signal, a source terminal, and a drain terminal that is coupled to the source terminal, and a second NMOS transistor having a gate terminal to receive the write enable signal, a source terminal that is coupled to ground, and a drain terminal that is coupled to the drain terminal of the first NMOS transistor. The gate driver circuit may include a first CMOS inverter to receive the data signal and a second CMOS inverter to receive the complementary data signal. The first CMOS inverter may output the complementary bus signal, and the second CMOS inverter may output the bus signal. The write enable circuit may be coupled to the first CMOS inverter to cause the complementary bus signal to be a negative voltage based on the falling edge of the write enable signal. The drain terminal of the first NMOS transistor may be coupled to the drain terminal of the second NMOS transistor, and the drain terminals of the first and second NMOS transistors may be coupled to the first and second CMOS inverters. The first CMOS inverter may include a first PMOS transistor and a third NMOS transistor, and the second CMOS inverter may include a second PMOS transistor and a fourth NMOS transistor. The first PMOS transistor of the first CMOS inverter may include a source terminal coupled to the supply voltage, a gate terminal coupled to the data signal, and a drain terminal coupled to the complimentary bus signal, and the third NMOS transistor of the first CMOS inverter may include a drain terminal coupled to the complementary bus signal, a gate terminal coupled to the data signal, and a source terminal coupled to the write enable circuit. The second PMOS transistor of the second CMOS inverter may include a source terminal coupled to the supply voltage, a gate terminal coupled to the complementary data signal, and a drain terminal coupled to the bus signal, and the fourth NMOS transistor of the second CMOS inverter may include a drain terminal coupled to the bus signal, a gate terminal coupled to the complimentary data signal, and a source terminal coupled to the write enable signal. The drain terminals of the first and second NMOS transistors are coupled to the source terminals of the third and fourth NMOS transistors.

According to an aspect of one or more examples, there is provided a method of writing data to a memory cell. The method may include generating a write enable signal to control writing of data to a memory cell, receiving a data signal and a complementary data signal corresponding to the data to be written to the memory cell, outputting a bus signal and a complementary bus signal based on the write enable signal, the data signal, and the complementary data signal, and storing the data in the memory cell based on a falling edge of the write enable signal. The data may be stored in the memory cell based on a falling edge of the write enable signal when a supply voltage is below a first threshold voltage. The data may be stored in the memory cell based on a rising edge of the write enable signal when a supply voltage is above a second threshold voltage. The method may also include adjusting a pulse width of the write enable signal to control writing data to the memory cell based on the falling edge of the write enable signal. The first threshold voltage may be approximately 0.5 volts and the second threshold voltage may be approximately 0.8 volts. The first threshold voltage may be approximately equal to the second threshold voltage.

DETAILED DESCRIPTION OF VARIOUS EXAMPLES

Figure 1:
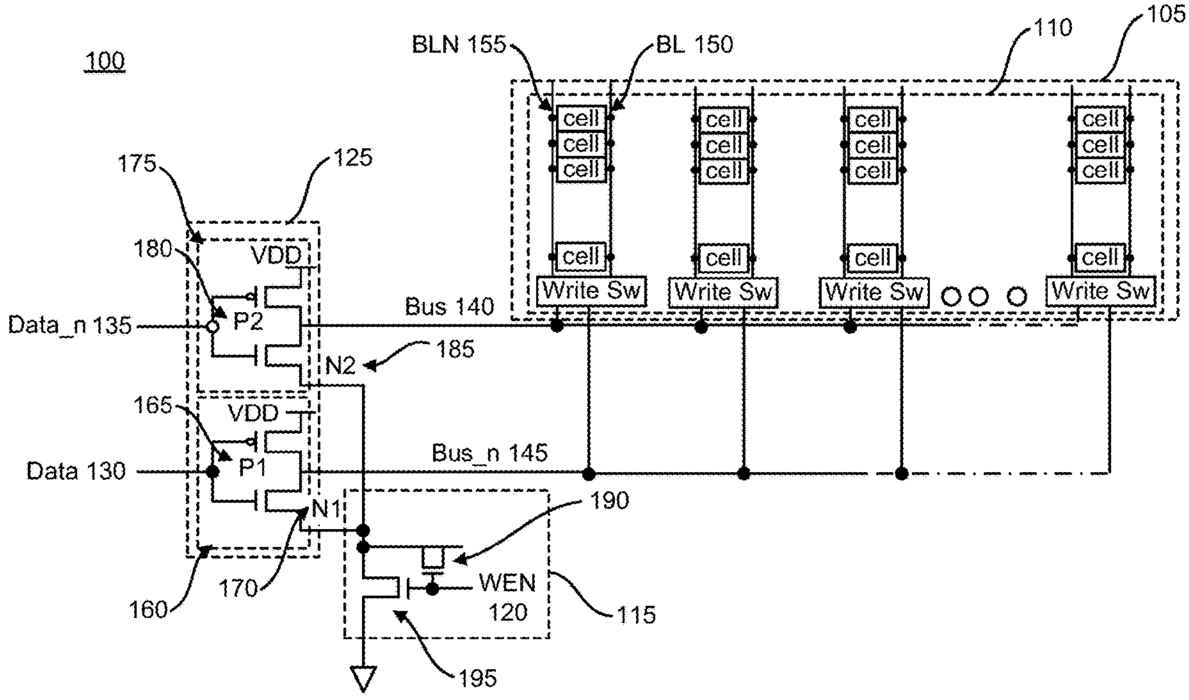
FIG. 1 shows a circuit for driving a write operation of a memory cell according to one or more examples.

Reference will now be made in detail to the following various examples, which are illustrated in the accompanying drawings, wherein like reference numerals refer to like elements throughout. The following examples may be embodied in various forms without being limited to the examples set forth herein.

The present disclosure relates to a write operation for solid state memory devices, such as static random access memory (SRAM). A write operation may rely on a supply voltage that exceeds a certain threshold, e.g., 0.8 volts, in order to write data to a memory cell. However, certain applications require lower supply voltages, e.g., less than 0.5 volts, that may result in write operation failures, particularly at extremely cold temperatures. Therefore, there is a need for an apparatus and method of conducting a write operation at lower supply voltages.

FIG. 1 shows a circuit 100 for driving a write operation of a memory cell according to one or more examples. The example circuit 100 of FIG. 1 includes an SRAM memory 105 that may include a plurality of memory cells 110. Although the example circuit 100 of FIG. 1 is shown using SRAM memory 105, other types of memory may be used. The example circuit 100 may also include a write enable circuit 115 that enables a write operation to write data to the memory cells 110 of the SRAM memory 105. The write enable circuit 115 may receive a write enable signal (WEN) 120 to control a write operation. The example circuit 100 may also include a write driver circuit 125 that is coupled to the write enable circuit 115 and to the SRAM memory 105. The write driver circuit 125 may receive data that is to be written into the SRAM memory 105, and output signals to the SRAM memory 105 based on the write enable signal (WEN) 120.

More specifically, the write driver circuit 125 may receive a data signal (Data) 130 and a complementary data signal (Data_n) 135, and may output a bus signal (Bus) 140 and a complementary bus signal (Bus_n) 145. The bus signal (Bus) 140 and the complementary bus signal (Bus_n) 145 are coupled to a bitline (BL) 150 and a complementary bitline (BLN) 155 for respective groups of memory cells 110 in the SRAM memory 105. The bitline (BL) 150 and complementary bitline (BLN) 155 are coupled to internal nodes Q and Q_n, (e.g., Q 210 and Q_n 215 described in FIGS. 2 and 3) within respective memory cells 110 that store data in respective memory cells 110.

The write driver circuit 125 may include a first CMOS inverter 160 to receive the data signal (Data) 130, and output the complementary bus signal (Bus_n) 145. The first CMOS inverter 160 includes a PMOS transistor P1 165 and an NMOS transistor N1 170 having respective gate terminals that are configured to receive the data signal (Data) 130. A source terminal of the PMOS transistor P1 165 is coupled to a supply voltage $V_{DD}$. A drain terminal of the PMOS transistor P1 165 is coupled to a drain terminal of the NMOS transistor N1 170, which output the complementary bus signal (Bus_n) 145. A source terminal of the NMOS transistor N1 170 of the first CMOS inverter 160 is coupled to the write enable circuit 115, as explained further below.

The write driver circuit 125 may also include a second CMOS inverter 175 to receive the complementary data signal (Data_n) 135 and output the bus signal (Bus) 140. The second CMOS inverter 175 includes a PMOS transistor P2 180 and an NMOS transistor N2 185 having respective gate terminals that are configured to receive the complementary data signal (Data_n) 135. A source terminal of the PMOS transistor P2 180 is coupled to the supply voltage $V_{DD}$. A drain terminal of the PMOS transistor P2 180 is coupled to a drain terminal of the NMOS transistor N2 185, which outputs the bus signal (Bus) 140. A source terminal of the NMOS transistor N2 185 of the second CMOS inverter 175 is coupled to the write enable circuit 115, and the source terminal of the NMOS transistor N1 170 of the first CMOS inverter 160, as explained further below.

The write enable circuit 115 includes a first NMOS transistor 190 and a second NMOS transistor 195 having gate terminals to receive the write enable signal WEN 120. The first NMOS transistor 190 of the write enable circuit 115 includes a drain terminal and a source terminal, which are coupled together. The second NMOS transistor 195 of the write enable circuit 115 includes a source terminal that is coupled to ground or to a second supply voltage $V_{SS}$ (not shown in FIG. 1) that is less than the supply voltage $V_{DD}$. The second NMOS transistor 195 of the write enable circuit 115 includes a drain terminal that is coupled to the drain terminal of the first NMOS transistor 190. The drain terminals of the first and second NMOS transistors 190 and 195 of the write enable circuit 115 are coupled to the source terminals of the NMOS transistors N1, N2 170 and 185 of the first and second CMOS inverters 160 and 175.

Figure 2A:
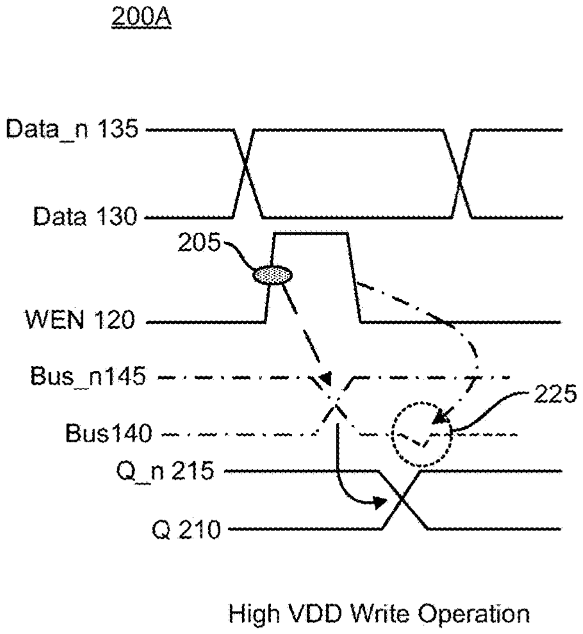
FIG. 2A shows a timing diagram of various signals according to the operation of the circuit shown in FIG. 1 when a supply voltage is greater than a threshold voltage.
Figure 2B:
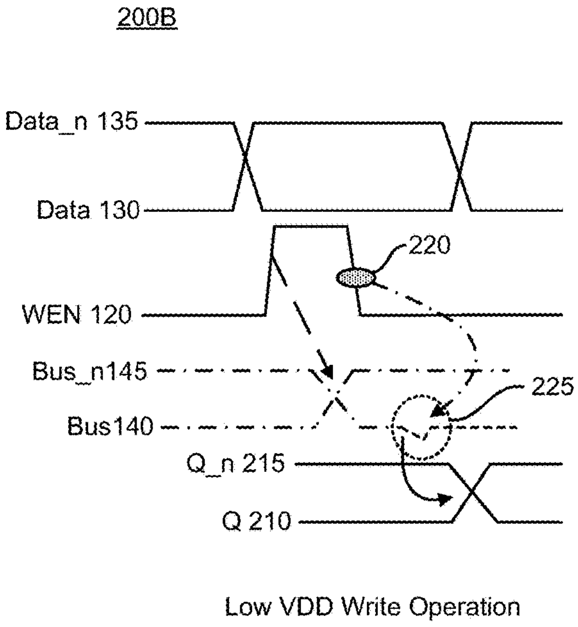
FIG. 2B shows a timing diagram of various signals according to the operation of the circuit shown in FIG. 1 when a supply voltage is less than a threshold voltage.

Operation of the circuit 100 shown in FIG. 1 will be described below with reference to FIGS. 2A and 2B. FIG. 2A shows a timing diagram 200A of various signals according to the operation of the circuit 100 shown in FIG. 1 when the supply voltage $V_{DD}$ is greater than a threshold voltage according to various examples. FIG. 2B shows a timing diagram 200B of various signals according to the operation of the circuit 100 shown in FIG. 1 when the supply voltage $V_{DD}$ is less than a threshold voltage according to various examples. According to one or more examples, the threshold may be approximately 0.5 volts, although the threshold may vary. For example, the threshold may be a range of voltages. For example, FIG. 2A may show operation of the circuit 100 of FIG. 1 when the supply voltage $V_{DD}$ is high, such as approximately 0.8 volts or 0.9 volts, and FIG. 2B may show operation of the circuit 100 of FIG. 1 when the supply voltage $V_{DD}$ is low, such as approximately 0.4 volts.

FIG. 2A shows a timing diagram 200A of various signals according to the operation of the circuit 100 of FIG. 1 when a supply voltage $V_{DD}$ is high, for example approximately 0.8 volts. At the rising edge 205 of the write enable signal WEN 120, the data signal (Data) 130 is logic high, and the complementary data signal (Data_n) 135 is logic low. The rising edge 205 of the write enable signal WEN 120 causes the first and second NMOS transistors 190 and 195 of the write enable circuit 115 to turn on, which causes the source terminals of the NMOS transistors N1, N2 170 and 185 of the first and second CMOS inverters 160 and 175 to be coupled to ground. The logic high level of the data signal (Data) 130 causes the NMOS transistor N1 170 of the first CMOS inverter 160 to turn on, which causes the complementary bus signal (Bus_n) 145 to be at a logic low level. The logic low level of the complementary data signal (Data_n) 135 causes the PMOS transistor P2 180 to turn on, which couples the bus signal (Bus) 140 to the supply voltage $V_{DD}$, and results in a logic high level. As explained above with reference to FIG. 1, the bus signal (Bus) 140 and the complementary bus signal (Bus_n) 145 are coupled to the bitline (BL) 150 and complementary bitline (BLN) 155 corresponding to respective memory cells 110 within the SRAM memory 105.

Figure 3:
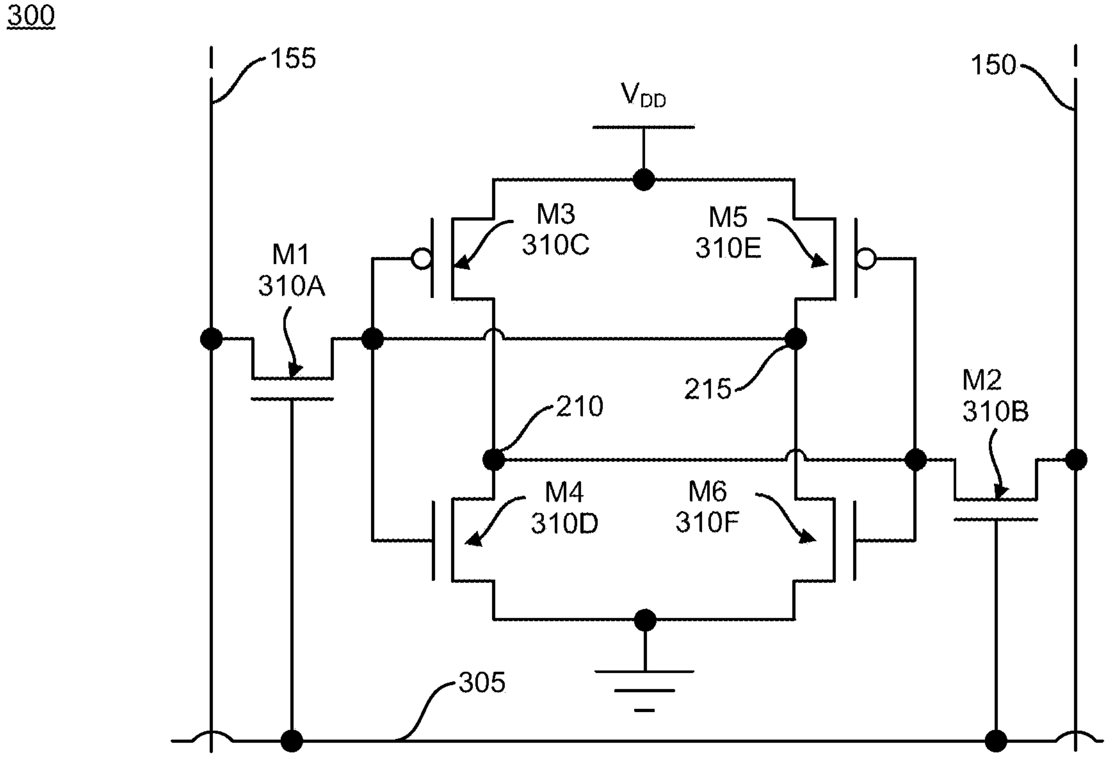
FIG. 3 shows a circuit diagram of an SRAM memory cell according to one or more examples.

FIG. 3 shows a circuit diagram 300 of an SRAM memory cell according to one or more examples. According to one or more examples, the SRAM memory cell may be one of the memory cells 110 described in FIG. 1. As shown in FIG. 3, the respective memory cells 110 include an internal node Q 210 and a complementary internal node Q_n 215 that store the logic high or logic low data in the memory cell 110. As shown in FIG. 2A, the internal node Q 210 becomes a logic high level in response to the bus line signal (Bus) 140 becoming a logic high level, and the complementary internal node Q_n 215 becomes a logic low level in response to the logic low level of the complementary bus signal (Bus_n) 145. Referring to FIG. 3, a wordline (WL) 305 is coupled to access MOSFETs M1 and M2 310A and 310B to selectively couple the bitline (BL) 150 and complementary bitline (BLN) 155 to the memory cell 110. The wordline (WL) 305 may be controlled to allow access to the memory cell 110 in coordination with the write enable signal WEN 120. When the wordline (WL) 305 is a logic high level, access MOSFETs M1 and M2 310A and 310B turn on, which couples the logic high signal of bitline (BL) 150 to the drain terminals of MOSFETs M3 and M4 310C and 310D and the gate terminals of MOSFETs M5 and M6 310E and 310F, and couples the logic low signal of complementary bitline (BLN) 155 to the drain terminals of MOSFETs M5, M6 310E and 310F and the gate terminals of MOSFETs M3, M4 310C and 310D. The bitline (BL) 150 signal causes MOSFET M6 310F to turn on and pull the complementary internal node Q_n 215 to a logic low level, and the complementary bitline (BLN) 155 causes MOSFET M3 310C to turn on and pull the internal node Q 210 to a logic high level. Therefore, the write operation is successful because the logic high data signal is written to the internal cell node Q 210. The write operation is successful because the difference between bus signal (Bus) 140 and the complementary bus signal (Bus_n) 145 is sufficient to enable the write operation. However, when the power supply $V_{DD}$ is a low voltage, e.g., 0.4 volts, the difference between the bus signal (Bus) 140 and the complementary bus signal (Bus_n) 145 may not be sufficient to enable a successful write operation.

FIG. 2B shows a timing diagram 200B of various signals according to the operation of the circuit 100 shown in FIG. 1 when a supply voltage $V_{DD}$ is less than a threshold voltage. For example, the voltage supply associated with FIG. 2B may be approximately 0.4 volts. The timing diagram 200B of FIG. 2B is similar to the timing diagram 200A of FIG. 2A in that at the rising edge 205 of the write enable signal WEN 120, the data signal (Data) 130 is logic high, and the complementary data signal (Data_n) 135 is logic low. The rising edge 205 of the write enable signal WEN 120 causes the first and second NMOS transistors 190 and 195 of the write enable circuit 115 to turn on, which causes the source terminals of the NMOS transistors N1, N2 170 and 185 of the first and second CMOS inverters 160 and 175 to be coupled to ground. The logic high level of the data signal (Data) 130 causes the NMOS transistor N1 170 of the first CMOS inverter 160 to turn on, which causes the complementary bus signal (Bus_n) 145 to be at a logic low level. The logic low level of the complementary data signal (Data_n) 135 causes the PMOS transistor P2 180 to turn on, which couples the bus signal (Bus) 140 to the supply voltage $V_{DD}$, and results in a logic high level. The bus signal (Bus) 140 and the complementary bus signal (Bus_n) 145 are coupled to a bitline (BL) 150 and complementary bitline (BLN) 155 corresponding to respective memory cells 110 within the SRAM memory 105, however, unlike the timing diagram 200A of FIG. 2A, the data is not stored in the internal node Q 210 and a complementary internal node Q_n 215 because the voltage difference between the bus signal (Bus) 140 and the complementary bus signal (Bus_n) 145 is insufficient to enable the write operation. However, the falling edge 220 of the write enable signal WEN 120 causes the voltage level of the complementary bus signal (Bus_n) 145 to become negative 225, which increases the difference between the bus signal (Bus) 140 and the complementary bus signal (Bus_n) 145 to a level sufficient to complete the write operation.

More specifically, when the write enable signal WEN 120 transitions from a logic high level to a logic low level, the first and second NMOS transistors 190 and 195 of the write enable circuit 115 turn off. Due to the parasitic capacitance associated with the coupling of the source and drain terminals of the first NMOS transistor 190 of the write enable circuit 115, the voltage at the source terminals of the NMOS transistors N1, N2 170 and 185 of the first and second CMOS inverters 160 and 175 becomes negative. Because the bus signal (Bus) 140 is still coupled to the supply voltage $V_{DD}$ via the PMOS transistor P2 180 of the second CMOS inverter 175, the difference between bus signal (Bus) 140 and the complementary bus signal (Bus_n) 145 increases when the complementary bus signal (Bus_n) 145 becomes a negative voltage 225. As shown in FIG. 2B, when the complementary bus signal (Bus_n) 145 becomes a negative voltage 225, the data is written to the internal cell Q 210 and the complementary internal cell Q_n 215. According to one or more examples, the pulse width of the write enable signal WEN 120 may be adjusted to control the speed of the operation. For example, by reducing the pulse width of the write enable signal WEN 120 (i.e., moving the falling edge 220 closer to the rising edge 205), the write operation may be completed more quickly because the negative voltage 225 on the complementary bus line (Bus_n) 145 corresponds to the falling edge 220 of the write enable signal WEN 120.

By using the falling edge 220 of the write enable signal WEN 120, the write operation may be completed during low voltage supply $V_{DD}$ operation, while the rising edge 205 of the write enable signal WEN 120 may be used to complete a write operation during high voltage supply $V_{DD}$ operation. Moreover, the write enable circuit 115 according to one or more examples may be compact. For example, the write enable circuit 115 of FIG. 1 may include two NMOS transistors (e.g., first and second NMOS transistors 190 and 195 in FIG. 1), which may be more compact than other write driver circuitry.

Various examples have been disclosed herein, in connection with the above description and the drawings. It will be understood that it would be unduly repetitious to literally describe and illustrate every combination and subcombination of these examples. Accordingly, all examples can be combined in any way or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. An apparatus comprising:

a write enable circuit to receive a write enable signal for writing data to a memory cell; and a write driver circuit to receive a data signal and a complementary data signal, and output a bus signal and a complementary bus signal to the memory cell, wherein the write driver circuit is coupled to an output of the write enable circuit;

wherein the write enable circuit is to initiate a write operation to write data to the memory cell in response to the write enable signal transitioning from a logic high level to a logic low level, when a supply voltage to the write driver circuit is below a first threshold voltage.

2. The apparatus of claim 1, wherein the write enable circuit is to initiate a write operation to write data to the memory cell based on a rising edge of the write enable signal when the supply voltage to the write driver circuit is above a second threshold voltage.

3. The apparatus of claim 2, wherein a time at which the data is written to the memory cell in response to the write enable signal transitioning from a logic high level to a logic low level is configurable based on a pulse width of the write enable signal.

4. The apparatus of claim 2, wherein the first threshold voltage is approximately 0.5 volts and the second threshold voltage is approximately 0.8 volts.

5. The apparatus of claim 1, wherein the write enable circuit comprises:

a first NMOS transistor having a gate terminal to receive the write enable signal, a source terminal, and a drain terminal that is coupled to the source terminal; and a second NMOS transistor having a gate terminal to receive the write enable signal, a source terminal that is coupled to ground, and a drain terminal that is coupled to the drain terminal of the first NMOS transistor.

6. The apparatus of claim 5, wherein the write driver circuit comprises a first CMOS inverter to receive the data signal and a second CMOS inverter to receive the complementary data signal.

7. The apparatus of claim 6, wherein the first CMOS inverter is to output the complementary bus signal, and the second CMOS inverter is to output the bus signal.

8. The apparatus of claim 7, wherein the write enable circuit is coupled to the first CMOS inverter to cause the complementary bus signal to be a negative voltage in response to the write enable signal transitioning from a logic high level to a logic low level.

9. The apparatus of claim 8, wherein the drain terminal of the first NMOS transistor is coupled to the drain terminal of the second NMOS transistor, and the drain terminals of the first and second NMOS transistors are coupled to the first and second CMOS inverters.

10. The apparatus of claim 6, wherein the first CMOS inverter comprises a first PMOS transistor and a third NMOS transistor, and the second CMOS inverter comprises a second PMOS transistor and a fourth NMOS transistor.

11. The apparatus of claim 10, wherein the first PMOS transistor of the first CMOS inverter comprises a source terminal coupled to the supply voltage, a gate terminal coupled to the data signal, and a drain terminal coupled to the complementary bus signal, and the third NMOS transistor of the first CMOS inverter comprises a drain terminal coupled to the complementary bus signal, a gate terminal coupled to the data signal, and a source terminal coupled to the write enable circuit.

12. The apparatus of claim 11, wherein the second PMOS transistor of the second CMOS inverter comprises a source terminal coupled to the supply voltage, a gate terminal coupled to the complementary data signal, and a drain terminal coupled to the bus signal, and the fourth NMOS transistor of the second CMOS inverter comprises a drain terminal coupled to the bus signal, a gate terminal coupled to the complementary data signal, and a source terminal coupled to the write enable circuit.

13. The apparatus of claim 12, wherein the drain terminals of the first and second NMOS transistors are coupled to the source terminals of the third and fourth NMOS transistors.

14. A method of writing data to a memory cell, the method comprising:

generating a write enable signal to control writing of data to a memory cell;

receiving a data signal and a complementary data signal corresponding to the data to be written to the memory cell;

outputting a bus signal and a complementary bus signal based on the write enable signal, the data signal, and the complementary data signal;

storing the data in the memory cell in response to the write enable signal transitioning from a logic high level to a logic low level, when a supply voltage is below a first threshold voltage.

15. The method of claim 14, wherein the data is stored in the memory cell based on a rising edge of the write enable signal when the supply voltage is above a second threshold voltage.

16. The method of claim 15, comprising adjusting a pulse width of the write enable signal to control writing data to the memory cell in response to the write enable signal transitioning from a logic high level to a logic low level.

17. The method of claim 15, wherein the first threshold voltage is approximately 0.5 volts and the second threshold voltage is approximately 0.8 volts.

18. The method of claim 15, wherein the first threshold voltage is approximately equal to the second threshold voltage.

19. The method of claim 14, wherein storing the data in the memory cell comprises causing the complementary bus signal to be a negative voltage in response to the write enable signal transitioning from a logic high level to a logic low level.

20. The apparatus of claim 1, wherein the memory cell is a static random access memory (SRAM) cell.

* * * * *